(12) United States Patent
Brovelli et al.

(10) Patent No.: US 11,038,075 B2
(45) Date of Patent: *Jun. 15, 2021

(54) LARGE AREA LUMINESCENT SOLAR CONCENTRATOR BASED ON INDIRECT BAND-GAP SEMICONDUCTOR NANOCRYSTALS

(71) Applicant: UNIVERSITA' DEGLI STUDI DI MILANO—BICOCCA, Milan (IT)

(72) Inventors: Sergio Brovelli, Milan (IT); Francesco Meinardi, Lecco (IT)

(73) Assignee: UNIVERSITA' DEGLI STUDI DI MILANO—BICOCCA, Milan (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/096,424

(22) PCT Filed: Apr. 24, 2017

(86) PCT No.: PCT/EP2017/059659
§ 371 (c)(1),
(2) Date: Oct. 25, 2018

(87) PCT Pub. No.: WO2017/186642
PCT Pub. Date: Nov. 2, 2017

(65) Prior Publication Data
US 2019/0148577 A1    May 16, 2019

(30) Foreign Application Priority Data
Apr. 27, 2016   (IT) .................... 102016000042717

(51) Int. Cl.
*H01L 31/055* (2014.01)
*C09K 11/59* (2006.01)
*C09K 11/02* (2006.01)
*F24S 20/20* (2018.01)
(Continued)

(52) U.S. Cl.
CPC ............ *H01L 31/055* (2013.01); *C09K 11/02* (2013.01); *C09K 11/59* (2013.01); *F24S 20/20* (2018.05); *H01L 31/1868* (2013.01); *H01L 51/448* (2013.01); *Y02E 10/52* (2013.01)

(58) Field of Classification Search
CPC ...... H01L 31/055; H01L 51/448; F24S 20/20; C09K 11/02; C09K 11/59
See application file for complete search history.

(56) References Cited

U.S. PATENT DOCUMENTS

| | | | |
|---|---|---|---|
| 2004/0095658 A1* | 5/2004 | Buretea | C03C 14/006 359/853 |
| 2007/0012355 A1 | 1/2007 | LoCascio et al. | |
| 2013/0146141 A1 | 6/2013 | Pelton et al. | |

(Continued)

OTHER PUBLICATIONS

International Search Report and Written Opinion issued in connection with the corresponding PCT/EP2017/059659, dated Jun. 6, 2017. (10 pages).

(Continued)

*Primary Examiner* — Courtney D Thomas
(74) *Attorney, Agent, or Firm* — Lucas & Mercanti, LLP

(57) ABSTRACT

The object of the invention is a luminescent solar concentrator having a vitreous or plastic matrix containing colloidal indirect band-gap semiconductor nanocrystals and in particular silicon nanocrystals.

17 Claims, 5 Drawing Sheets

(51) Int. Cl.
*H01L 31/18* (2006.01)
*H01L 51/44* (2006.01)

(56) References Cited

U.S. PATENT DOCUMENTS

2016/0380140 A1\* 12/2016 McDaniel ............ C09K 11/025
  136/247
2019/0148577 A1\* 5/2019 Brovelli ................ H01L 51/448
  136/247

OTHER PUBLICATIONS

Beard Mc et al: "Multiple Exciton Generation in Colloidal Silicon Nanocrystals", Nano Letters, American Chemical Society, US, vol. 7, No. 8, Aug. 8, 2007 (Aug. 8, 2007), pp. 2506-2512.

\* cited by examiner

LARGE AREA LUMINESCENT SOLAR CONCENTRATOR BASED ON INDIRECT BAND-GAP SEMICONDUCTOR NANOCRYSTALS

CROSS-REFERENCE TO RELATED APPLICATIONS

This application is a 371 of PCT/EP2017/059659, filed Apr. 24, 2017, which claims the benefit of Italian Patent Application No. 102016000042717, filed Apr. 27, 2016.

This invention relates to a solar concentrator according to the precharacterising clause of the principal claim.

BACKGROUND OF THE INVENTION

As is known, luminescent solar concentrators (or LSC) comprise a glass or plastics waveguide defining the body of the concentrator doped with highly emissive elements commonly referred to as fluorophores, or coated with a film containing the same. Direct and/or diffuse sunlight are absorbed by such fluorophores and reemitted at a longer wavelength. The luminescence generated in this way propagates towards the edges of the waveguide through total internal reflection and is converted into electrical energy by photovoltaic cells attached to the perimeter of the concentrator body.

Normally such luminescent solar concentrators comprise a body having the generic form of a sheet or parallelepiped (defining the abovementioned waveguide) doped with organic or organometallic fluorophores or ones based on colloidal nanoparticles. Alternatively the surface of such body is coated with thin films containing the fluorophores.

The fluorophores absorb sunlight, both diffuse and incident sunlight, and re-emit it by fluorescence or phosphorescence at a longer wavelength. The emitted light is guided to the edges of the waveguide by total internal reflection where it is converted into electricity by small photovoltaic cells located along the sides or perimetral surfaces of the waveguide. By appropriately selecting the fluorophore concentration in the waveguide and its optical properties it is possible to construct devices having the desired degree of transparency and of arbitrary shape which can be readily incorporated in architecture, such as for example photovoltaic windows.

Luminescent solar concentrators are therefore more practical devices than known systems operating on the basis of geometrical concentration of the solar radiation, which require mechanisms that follow the light source.

Finally, because the photovoltaic cells located at the edges of the concentrator (acting as a waveguide) are indirectly illuminated by the luminescence created within the concentrator, luminescent solar concentrators do not experience any loss of efficiency and electrical stresses deriving from the shadows created on them, as in ordinary massive and thin film photovoltaic panels.

In order to obtain efficient solar concentrators the fluorophores need to be highly photostable and have a wide absorption spectrum in the visible region of the spectrum and the near infrared, high luminescence efficiency and the greatest possible energy separation between their own absorption spectrum and the optical emission spectrum (indicated by the term "Stokes shift"). The latter requirement is essential for manufacturing large concentrators in which the light emitted from a given fluorophore has to travel a relatively long way before reaching the edge of the concentrator body.

The use of organic fluorophores, which are highly emissive but relatively photodegradable, is known. Their Stokes shift is typically limited, and this results in significant optical losses due to reabsorption of the light emitted by the fluorophores themselves.

The use of fluorophores defined by organic rare earth complexes having wide Stokes shifts is also known; however such elements are only able to make use of a small portion of the solar spectrum and/or exhibit very low luminescence efficiencies. Similar problems are encountered when colloidal nanocrystals (QD) are used as emitters incorporated in the body or waveguide of a solar concentrator. Although such nanocrystals have a high emission yield and a high optical absorption coefficient, they generally have a large overlap between the absorption and emission spectra, resulting in strong reabsorption of the emitted light. This fact is an impediment to the construction of solar concentrators of large size, and only make it possible to obtain devices of very small area.

Recently colloidal nanocrystals (QD or "quantum dot(s)"), which demonstrate a wide absorption spectrum and efficient luminescence, and can also be adjusted to capture or collect maximum solar radiation in the visible or near infrared (NIR) spectral region, so as to obtain maximum response from luminescent solar concentrators (LSC), have also been used. This has also been achieved by selecting heterostructured or doped nanocrystals or using ternary semiconductor compositions resulting in intrinsic uncoupling between the absorption and emission functions.

The text filed under number PCT/IB2016/000032 in the name of the proprietor of this document describes a solar concentrator comprising a body of polymer material or silica-based glass containing colloidal nanocrystals, where the latter are at least ternary chalcogen semiconductor nanocrystals containing transition metals in group $I_B$ or group 11 of the IUPAC nomenclature, metals in group $III_A$ or group 13 of the IUPAC nomenclature and at least one chalcogen from group $VI_A$ or group 16 of the IUPAC nomenclature.

That patent text, which indicates various types of usable semiconductors, describes a solution through which solar concentrators of large size (up to hundreds of linear centimetres) can be obtained with limited optical losses due to the reabsorption of emitted light, with high transparency, which are also suitable for use as photovoltaic windows within architectural structures or moving structures such as motor vehicles or vehicles in general.

The concentrators that are the subject of the aforesaid PCT application, although solving a variety of solar concentrator problems known before filing of that application, require for their construction materials or elements which are not widely present in large quantities on the earth. It follows that the costs of obtaining said materials, from both the economical and political points of view, are quite high, with consequent high costs for the LSC containing them.

US2007/0012355 describes a solar cell including a semiconductor base layer, a semiconductor nanocrystal complex over the semiconductor base layer, and a semiconductor emitter layer formed over the semiconductor nanocrystal complex. The purpose of the semiconductor nanocrystal complex is to modify the intrinsic absorption properties of the solar cell by creating a so-called "intermediate band gap cell".

This prior document does not describe a luminescent solar concentrator or suggest the use of QDs in a luminescent solar concentrator.

SUMMARY OF THE INVENTION

The object of this invention is to provide a luminescent solar concentrator (LSC) that is improved in comparison with known solutions.

In particular one object of this invention is to provide a solar concentrator using colloidal nanocrystals in which there is uncoupling between the absorption and emission functions, thus making it possible to have high efficiency, or a solar concentrator which has very low or even negligible (although not zero) optical losses due to reabsorption and at the same time has very low construction costs in comparison with similar known LSC.

Another object is to provide a device or solar concentrator that can be constructed using materials present on the earth in large quantities with an almost planet-wide distribution, thus permitting further reduction in the costs of producing LSC and the political constraints on obtaining such materials.

Another object is to provide a device or solar concentrator which has an absorption spectrum that extends to the entire visible region and the near infrared (NIR), so as to maximise the fraction of sunlight which can be utilised in order to generate electrical energy, all through suitable control of the dimensions of the particles of the materials contained in the LSC.

This and other objects which will be obvious to those skilled in the art will be achieved through a luminescent solar concentrator according to the appended claims.

BRIEF DESCRIPTION OF THE DRAWINGS

For better understanding of the present invention there are appended purely by way of a non-limiting example the following drawings, in which.

DETAILED DESCRIPTION OF THE DRAWINGS

Figure 1:
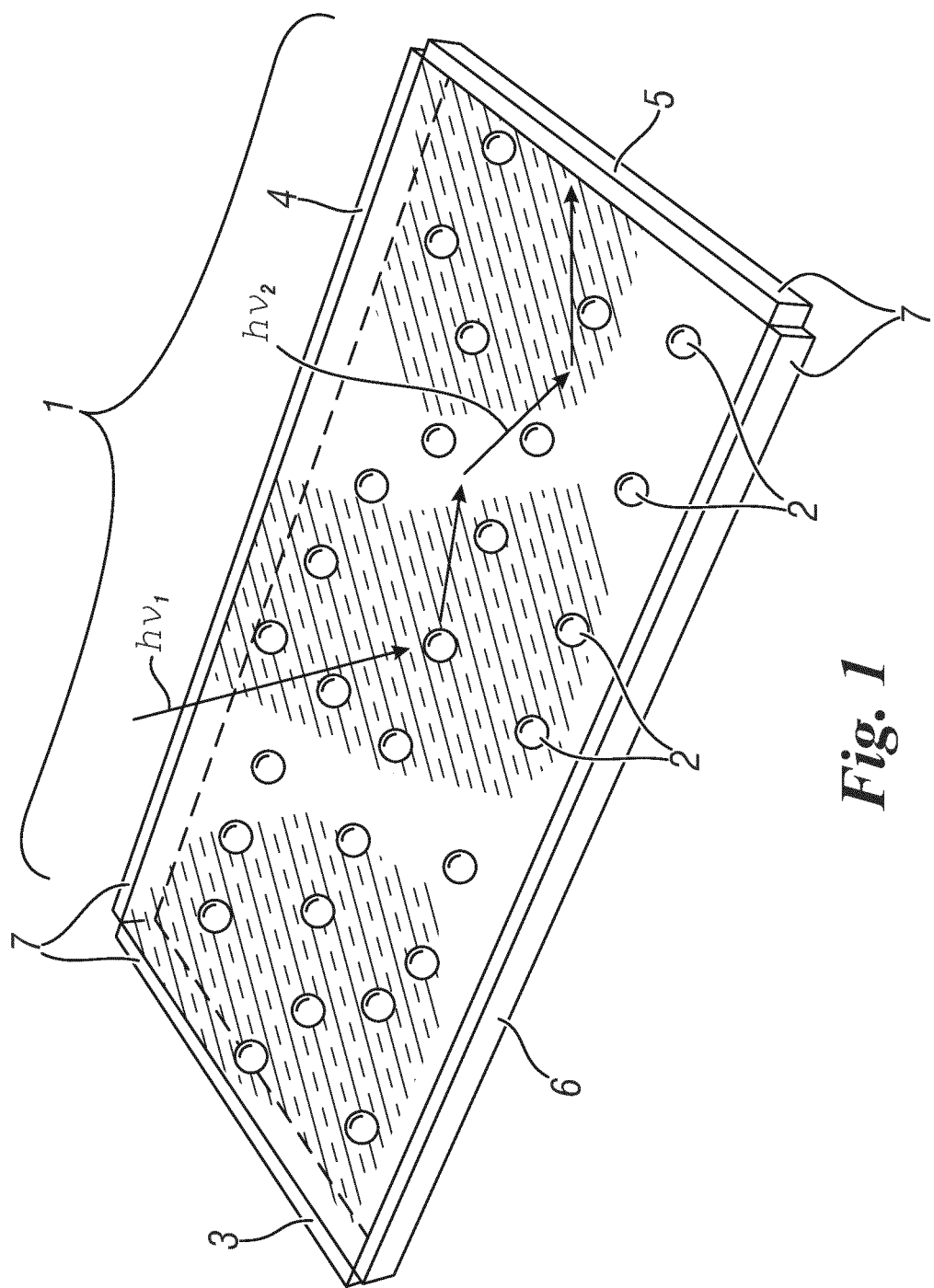
FIG. 1 shows a diagrammatical representation of a luminescent solar concentrator (LSC) comprising a polymer matrix incorporating colloidal nanocrystals or QD.

With reference to said figures, a luminescent solar concentrator or LSC comprises a body 1, which may be constructed of glass or plastics material, in which there are present nanocrystals which purely for the purpose of description are illustrated as readily identifiable elements within body 1 of the concentrator; these nanocrystals (QD) or nanoparticles are indicated by 2. At the edges 3,4, 5,6 of body 1 there are photovoltaic cells 7 that are capable of collecting the emitted light radiation (indicated as hv$_2$) from the QD present in body 1 and converting it into electricity. The incident radiation on the body of the device is indicated by hv$_1$.

Alternatively the nanocrystals may be embedded in the plastics or glass film coating the body of the concentrator.

Body 1 of the LSC, or the film with which the body is coated, may be obtained from different materials. By way of an example, but which is not limiting, the latter may be: polyacrylates and polymethylmethacrylates, polyolefins, polyvinyls, epoxy resins, polycarbonates, polyacetates, polyamides, polyurethanes, polyketones, polyesters, polycyanoacrylates, silicones, polyglycols, polyimides, fluorinated polymers, polycellulose and derivatives such as methyl cellulose, hydroxymethyl cellulose, polyoxazine, glasses or silica base.

The nanocrystals or nanoparticles are elements having dimensions which are typically smaller than the Bohr exciton diameter (typically less than 10 nm) characteristic of the corresponding bulk material of the same composition, to exhibit quantum confinement. These QD have the ability to exhibit photoluminescence efficiency of almost 100% and an emission spectrum which can be selected through dimensional control of the particles, which makes it possible for them to be optimally integrated with various types of solar cells including single and multiple junction devices.

According to one fundamental characteristic of this invention the colloidal nanocrystals used as emitters in the LSC described are indirect band-gap semiconducting QD comprising by way of non-exhaustive example: 1) an element of group IV$_A$ or group 14 of the IUPAC nomenclature, such as carbon, silicon, germanium, tin and their compounds such as SiC and alloys; 2) compounds of elements in groups III$_A$ and V$_A$ or groups 13 and 15 of the IUPAC nomenclature such as BN, BP, BAs, B$_{12}$As$_2$, AlP, AlS, GaP and their alloys; 3) compounds of elements in groups VI$_B$ and VI$_A$ or groups of 6 and 16 of the IUPAC nomenclature such as MoS$_2$; 4) other indirect band-gap semiconductors such as CuS$_2$ and GaSe.

This particular choice of QD makes it possible to construct luminescent solar concentrators of large size (tens/hundreds of linear centimetres) with limited optical losses due to reabsorption of the emitted light. The concentration of nanocrystals (typically between 0.001% and 5% by weight) dispersed in the solid matrix or body 1, or in the film coating it, determines the level of transparency in the concentrator or device and therefore makes it possible to manufacture semitransparent solar concentrators which are suitable for use as photovoltaic windows within architectural structures such as buildings, or moving structures such as motor vehicles.

The choice of indirect gap semiconductors, for example, silicon, derives from the fact that many of these are among the most abundant elements on the earth and their annual production amounts to millions of tonnes.

In addition to this, in indirect band-gap semiconductors such as silicon, light emission in the energy transition from the conduction band to the valency band is generally negligible. However, if semiconductors of this type are confined by their massive shape to nanoparticles having dimensions comparable with or smaller than their Bohr exciton diameter (commonly known as quantum confinement), the nanostructures may become strongly luminescent because they partly overcome the physical selection rules relating to the conservation of momentum. In this way their emission efficiency can reach high values, in the case of silicon even above 50%, with further possibilities for improvement through refining growth processes and the passivation of surfaces. Control of quantum confinement also makes it possible to control the absorption and emission energies of the nanoparticles. In the case of silicon for example, the optical absorption and the photoluminescence spectra of the colloidal nanocrystals in the NIR spectral region can be adjusted towards the visible region of the spectrum.

Thanks to some indirect gap nanocrystals such as for example silicon, carbon and germanium it is also possible to construct large area LSC comprising exclusively non-toxic materials which are highly abundant on the earth.

Indirect gap QD such as for example silicon have a very low reabsorption capacity for emitted light; this fact, together with the high compatibility between these QD and polymer matrices defining the structure of LSC makes it possible to use almost ideal LSC devices which are free from reabsorption and diffusion losses.

Thanks to suppression of luminescence reabsorption, quantitative performance assessments indicate that these LSC can be constructed with a variety of dimensions even over 100×100 cm$^2$ with conversion efficiencies that are also higher than 5%.

Lastly, using said QD inserted in polymer matrices, it is possible to construct active photovoltaic structural elements which also have complex curvature, something which widens the extent to which they can be incorporated into structures without significant falls in the output of electricity from the photovoltaic cells in comparison with the situation for photovoltaic panels applied to flat roofs.

By way of a non-exhaustive example of the application of indirect band-gap QD for the construction of low reabsorption LSC, we report below the properties of an LSC based on silicon QD described initially with reference to FIG. 2.

Figure 2:
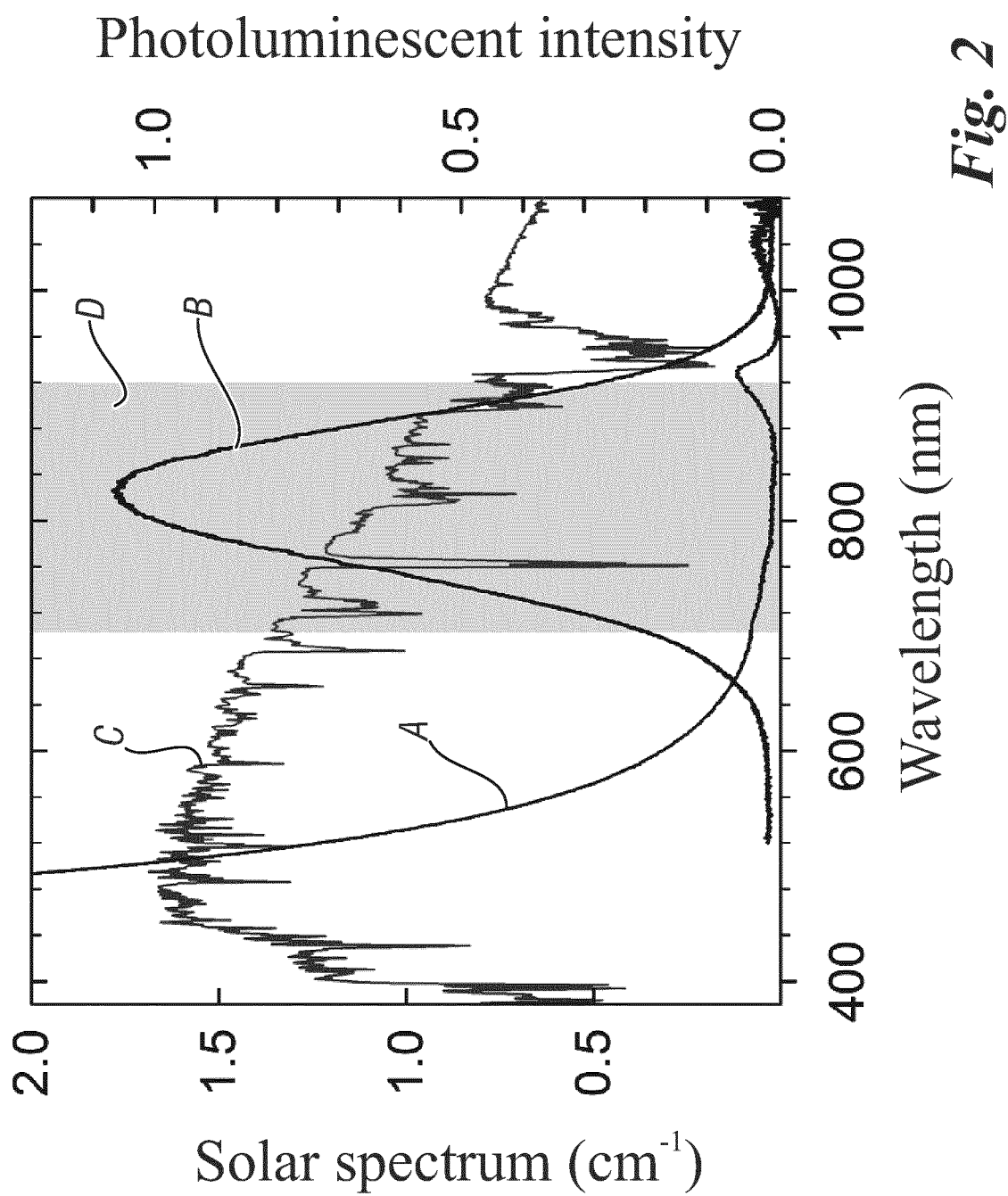
FIG. 2 shows an absorption spectrum (curve A) and photoluminescence spectrum (curve B) of silicon QD for obtaining the device or concentrator in FIG. 1, under optical excitation at 473 nm.

FIG. 2 shows the optical absorption and photoluminescence spectra of silicon QD dispersed in a polylauryl methacrylate (PLMA) matrix used for the manufacture of LSC waveguides, together with the terrestrial spectrum of solar radiation.

In FIG. 2 the absorption of silicon QD is represented by the curve indicated by the letter A, while photoluminescence is represented by the curve indicated by B. The curve indicated by C instead represents the spectrum of solar radiation, while the dark band (indicated by D in FIG. 2) represents the transparency window of the nanocomposite, which lies between the start of QD absorption and the C—H vibration harmonics of the polymer matrix at 930 nm.

The photoluminescence spectrum (curve B) has a peak in the optimum NIR transparency window of the composite forming the structure or body of the LSC, which ensures minimum reabsorption losses arising from large concentrator dimensions.

In order to establish the suitability of QD for the construction of LSC having large effective areas by experiment, a cross-linked semitransparent polylauryl-methacrylate LSC, in which the long side chains prevent agglomeration of the nanocrystals and ensure that polymer-QD nanocomposites of high optical quality can be manufactured, was produced.

The manufacturing procedure comprises an initial wetting of the QD in a small volume of lauryl methacrylate monomer (LMA) for approximately three hours to ensure that the individual particles are finely dispersed. The mixture so obtained is then added to a large volume of monomer together with a free radical photoinitiator (IRGACURE 651, in a quantity of 1% by weight or w/w) and ethylene glycol dimethacrylate (EGDM) which acts as the cross-linking agent. By selecting an appropriate quantity of EGDM it is possible to produce P(LMA-co-EGDM) nanocomposites doped with QD having the desired mechanical rigidity but which at the same time make it possible to construct flexible and foldable LSC solar concentrators.

For example an LMA to EDGM ratio of 80% to 20% by weight (w/w) results in rigid waveguides, while the addition of only 10% of EGDM by weight (w/w) makes it possible to obtain flexible solar concentrators or LSC.

It is important that the EGDM molecules which concatenate the main chains and ensure the mechanical stability of the flat bodies of LSC are located in the hydrophobic parts of the nanocomposites and are therefore separated from the QD so that they do not adversely affect their electronic properties.

After mixing for approximately twenty minutes and after the whole has been placed in an ultrasonic bath for thirty minutes, the solar concentrator is obtained by following the cell-casting procedure typically used for the preparation of optical grade polymer sheets.

Figure 3:
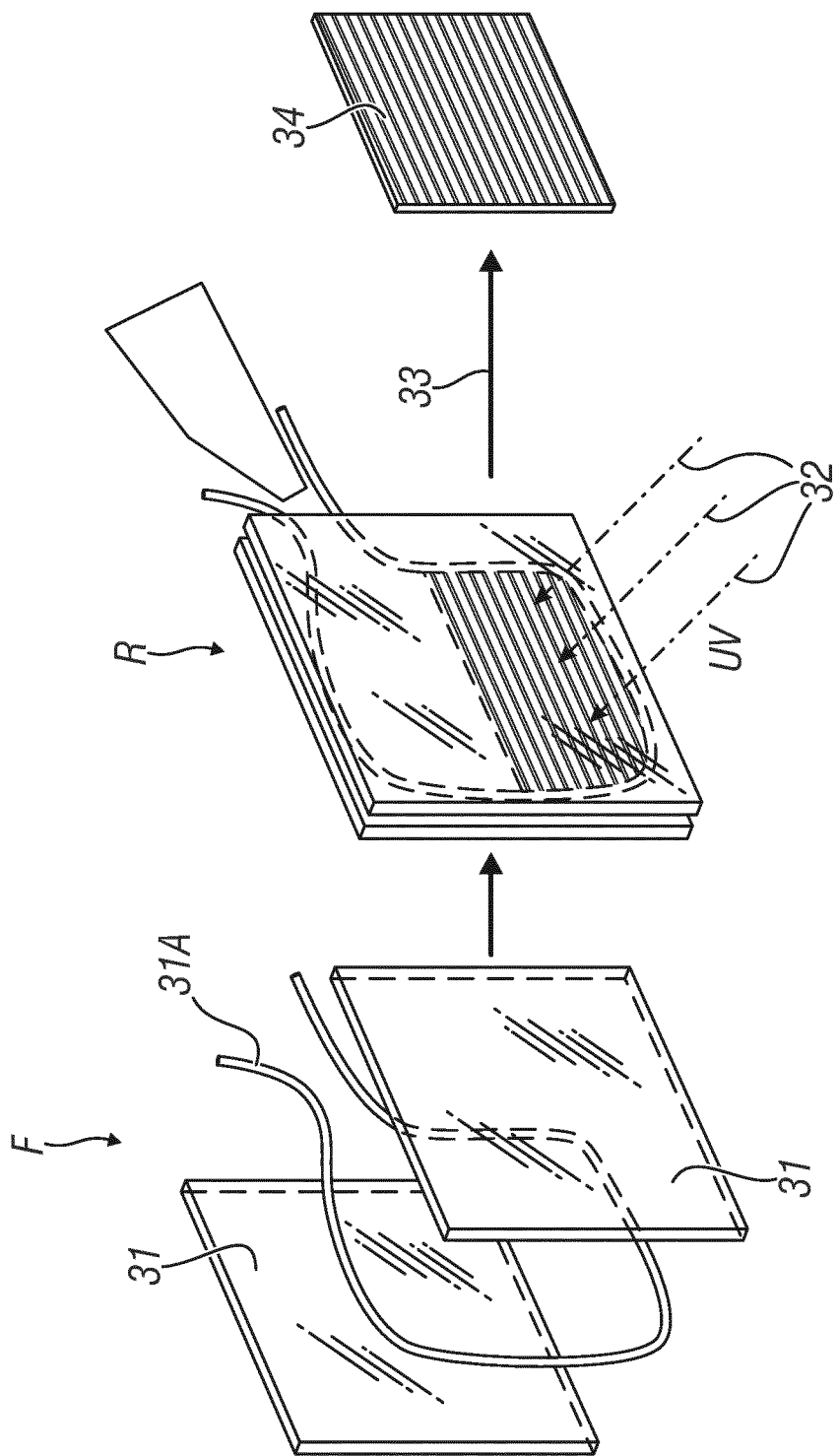
FIG. 3 shows a diagrammatical representation of the procedure for obtaining a cell for the construction of LSC according to the invention.

FIG. 3 illustrates diagrammatically the process for obtaining a solar concentrator sheet. Briefly the uniform mixture obtained as described above is poured into a tempered glass mould 31 having little roughness (see the stage indicated by arrow R in FIG. 3) and irradiated with light at 365 nm for twenty-five minutes to activate the free radical polymerisation. The latter is then completed by holding what has been obtained in a dark environment for thirty minutes, after which the waveguide or LSC can be removed from the mould, cut into portions of desired size and the edges can be smoothed.

The above is indicated in FIG. 3, where what is shown on the left-hand side and indicated by arrow F represents construction of the mould by coupling two sheets 31 between which there is located a flexible sealing element 31A; after these sheets have been coupled together the mixture indicated above is inserted into the mould (arrow R) and then to the final stage of obtaining the solar concentrator (indicated by 34), while arrow 33 indicates the final stages of the procedure described above which result in the concentrator being obtained.

An important aspect for the manufacture of LSC containing efficient indirect gap QD is conservation of the optical properties of the pure QD following their incorporation in the polymer nanocomposite. In spectroscopic studies of the nanocomposite containing silicon QD compared with a solution of silicon QD in toluene at the same concentration as that present in the nanocomposite, identical or substantially identical spectral properties were found. The two systems under test demonstrated substantially similar emission dynamics, with a weak acceleration for the silicon QD present in the polymer (probably linked to the activation of additional non-radiative channels) associated with a very small fall in the emission quantum efficiency value in the nanocomposite in comparison with that in toluene. These small non-radiative losses following exposure of the polymerisation free radical catalyst and UV radiation in air is particularly easy to see in the light of the fact that the metal silicide QD is not protected by additional passivation, which is instead necessary to preserve the group $I_B$ and $III_A$ metal chalcogenide QD used in the acrylic matrices used in solar concentrators constructed in accordance with the teaching of the preceding patent filed in the name of the same applicant referred to above. This intrinsic versatility in the conditions of manufacture of the device represent an important industrial advantage of silicon QD in comparison with known solutions in that it makes it possible to obtain high efficiency emitters for solar concentrators without incurring additional costs for their passivating overcoating.

The results obtained also demonstrate that the concentrator has high transparency in the visible spectrum. In parallel, conversion efficiency is comparable with at least the improved performance obtained using solar concentrators which were the subject of the previously filed patent in the name of the same applicant, which indicates that reabsorption losses are effectively eliminated in LSC containing indirect gap semiconductor QD.

Figure 4:
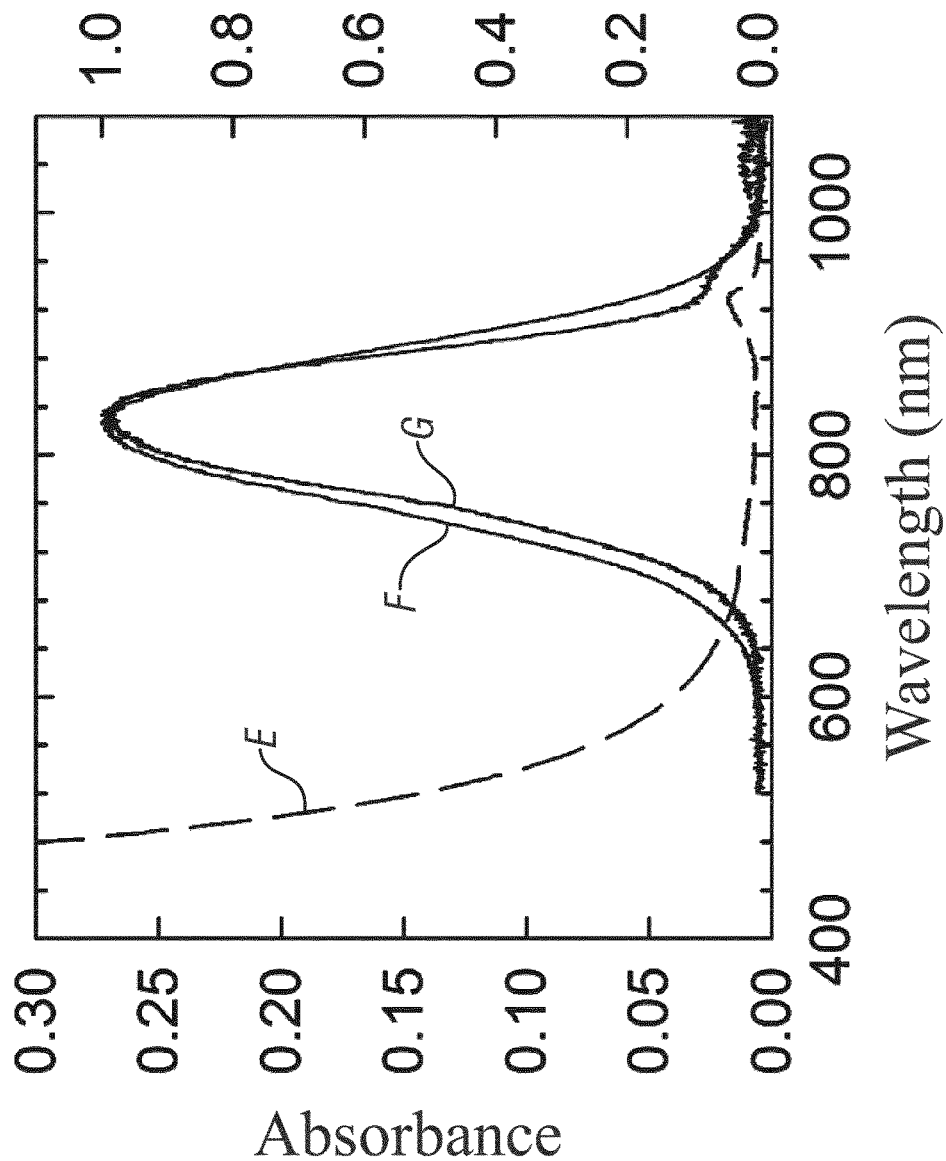
FIG. 4 shows a comparison of the absorption spectrum (curve E) and the photoluminescence spectra (curves F and G) from the excitation of silicon QD used for the example device under excitation at 473 nm, curves F and G relating to the luminescence spectra of LSC collected at the edge of a solar concentrator having dimensions of 144 cm$^2$ containing silicon QD that are excited at distances from the edge of d=0.5 cm for curve F and d=12 cm for curve G respectively.

In order to directly evaluate the reabsorption losses of a LSC according to the invention a rectangular sheet of polymer material containing silicon QD having an area of approximately 144 cm$^2$ was prepared. The optical absorption spectrum of the nanocomposite is shown in FIG. 4, curve E. Using a continuous excitation source at 473 nm the photoluminescence spectra shown in FIG. 4, in which curve F shows the excited spectrum at a distance d=0.5 cm from the edge of the sheet and curve G shows the excited spectrum at a distance d=12 cm from the edge of the sheet, were obtained.

The two emission peaks corresponding to luminescence generated directly at the edge of the sheet (curve F) and that guided for a further 10 cm within it (curve G) are substantially superimposable, demonstrating that reabsorption losses are strongly suppressed and confirming that with using indirect gap semiconductor QD it is possible to obtain emission which is precisely centred on the optimum NIR transparency window of the waveguide of the nanocomposite in FIG. 2. The small difference in the curves representing photoluminescence in FIG. 4 therefore indicates that the reabsorption losses associated with the QD are also small even in the case of LSC of relatively large size, also confirming that the QD emit within the optimum transparency band of the nanocomposite.

The experimental data provide optimum agreement with the simulated data, proving that an LSC containing indirect gap semiconductor QD behaves essentially like an ideal device in which each portion of the illuminated surface contributes equally to the total power generated by the concentrator.

Curved LSC were also constructed and the ability to obtain photovoltaic currents through these was tested. For this purpose a test LSC having an area of approximately 90 cm$^2$ of P(LMA-co-EGDM) doped with silicon QD (0.09% by weight) was constructed using the procedure described in connection with FIG. 2. In order to be able to bend the sheet, the ratio between the monomer and the cross-linking agent (or between LMA and EGDM) was selected to be 90%:10% by weight (w/w). In order to be able to experimentally quantify the effect of curvature on the waveguide properties of flexible LSC the light leaving one of the lateral sides of the concentrators was measured while increasing the spatial separation, d, between the excitation zone and the edge of the LSC. Various measurements for light propagation under identical normal excitation conditions and collection geometry for increasing curvature of the LSC, conditions quantified in terms of the central angle θ (where this angle is equal to 0° for a flat device and 180° for a completely bowed structure) were repeated.

Figure 5:
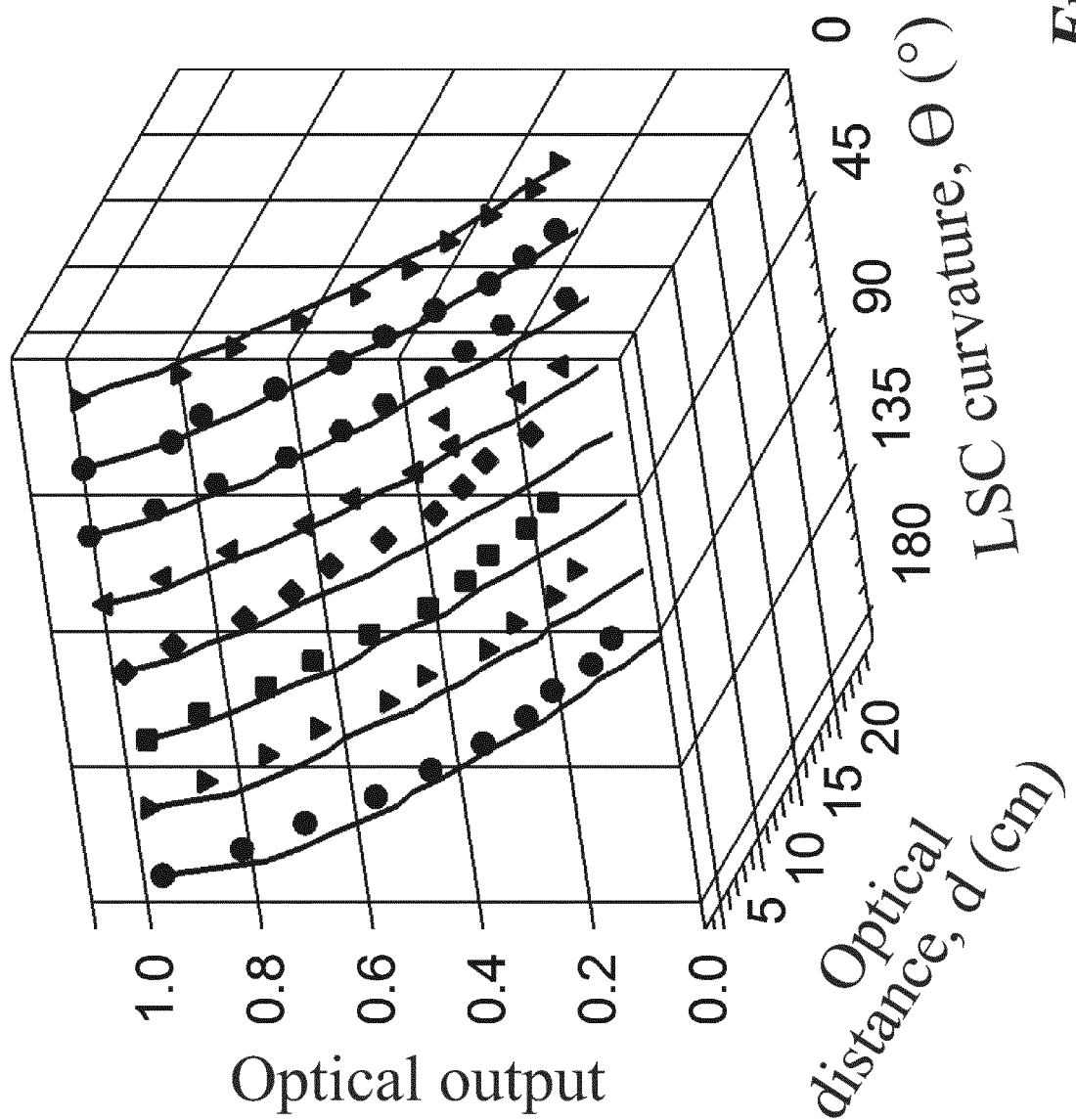
FIG. 5 shows curves relating to the photoluminescence optical signals obtained at different distances from excitation zone d using LSC having different curvatures, in a three-dimensional graph.

The outcome of the measurement for the exiting optical power data as a function of d and the aforesaid angle are shown in FIG. 5, from which it can be seen that the waveguide properties of the LSC are not affected by the curvature. In particular it will be noted from FIG. 5 that there is substantially no change in the intensity of the light emitted from the edge of the LSC depending upon the angle of curvature: this makes it possible to consider the possibility of using LSC containing indirect band-gap QD for the manufacture of semitransparent photovoltaic architectural elements of complex curvature (rounded, cup-shaped, spherical, configurations which can also be applied to ordinary tiles) without incurring the optical losses due to the reduced light guiding capacity.

The advantages of an LSC based on indirect band-gap colloidal nanostructures based exclusively on materials which are abundant on the earth, such as silicon, are obvious from the above. In fact by incorporating indirect gap QD in a polymerised acrylic matrix it has been demonstrated that it is possible to produce waveguides of high optical quality thanks to the large effective spectral separation between the optical absorption spectra and luminescence spectra of the QD, spectra which are essentially unaffected by optical losses associated with reabsorption of the guided luminescence within the structure of the LSC.

The efficiency of converting light into electricity is high (it can be assessed at some 30% of optical quantum efficiency) on surfaces having an area of approximately 150 cm$^2$, with a high degree of transparency in the visible spectrum (approximately 70%). All this makes these LSC excellent candidates for the construction of windows or other photovoltaic elements incorporated into structures, but also into moving means such as motor vehicles.

The very low costs of many indirect gap semiconductors, including silicon, also means that the solar concentrator sheets so obtained are highly economical.

A particular embodiment of the invention has been described; however others may be obtained in the light of the contents of the above description and should be regarded as falling within the scope of the following claims.

The invention claimed is:

1. Luminescent solar concentrator comprising a body of polymer material or silica-based glass and comprising colloidal nanocrystals, wherein the colloidal nanocrystals are indirect band-gap semiconductor nanocrystals.

2. The solar concentrator according to claim 1, wherein the nanocrystals are selected from colloidal nanocrystals of: 1) elements in group $IV_A$ or group 14 of the IUPAC nomenclature and their alloys; 2) compounds of elements in groups $III_A$ and $V_A$ or groups 13 and 15 of the IUPAC nomenclature and their alloys; 3) compounds of elements in groups $VI_B$ and $VI_A$ or groups 6 and 16 of the IUPAC nomenclature; 4) other indirect band-gap semiconductors.

3. The solar concentrator according to claim 1, wherein the nanocrystals have no additional passivation.

4. The solar concentrator according to claim 1, wherein the nanocrystals are covered with additional passivation layers of organic or inorganic material.

5. The solar concentrator according to claim 2, wherein the indirect gap semiconductor nanocrystals have at least one dimension which is comparable with or smaller than the Bohr exciton diameter of the corresponding bulk material.

6. The solar concentrator according to claim 1, having a sheet-like configuration with dimensions of between 5 cm$^2$ and 16 m$^2$.

7. The solar concentrator according to claim 1, further comprising a plastic body, said plastic body being a polymer or matrix or a vitreous matrix based on silica.

8. The solar concentrator according to claim 7, wherein such matrix comprises at least one of the following polymers: polyacrylates and polymethyl methacrylates, polyolefins, polyvinyls, epoxy resins, polycarbonates, polyacetates, polyamides, polyurethanes, polyketones, polyesters, polycyanoacrylates, silicones, polyglycols, polyimides, fluorinated polymers, polycellulose and derivatives such as methyl cellulose, hydroxymethyl cellulose, polyoxazine, and silica based glasses.

9. The solar concentrator according to claim 1, wherein the nanocrystals are dispersed in a plastics matrix or silica-based vitreous matrix in a percentage of between 0.001% and 5% by weight.

10. The solar concentrator according to claim 1, wherein the indirect band-gap nanocrystals are dispersed in a film covering the body of the concentrator.

11. A solar concentrator according to claim 1, having a planar or curved shape.

12. A window for construction or moving structures comprising at least one part constructed from a luminescent solar concentrator according to claim 1.

13. The solar concentrator according to claim 1, wherein the nanocrystals are selected from colloidal nanocrystals of carbon, silicon, germanium, tin and their compounds.

14. The solar concentrator according to claim 1, wherein the nanocrystals are colloidal nanocrystals of SiC.

15. The solar concentrator according to claim 1, wherein the nanocrystals are selected from colloidal nanocrystals of BN, BP, BAs, $B_{12}As_2$, AlP, AlS, and GaP.

16. The solar concentrator according to claim 1, wherein the nanocrystals are colloidal nanocrystals of $MoS_2$.

17. The solar concentrator according to claim 1, wherein the nanocrystals are selected from colloidal nanocrystals of $CuS_2$ and GaSe.

* * * * *